(12) United States Patent
Poirier

(10) Patent No.: US 12,095,466 B2
(45) Date of Patent: Sep. 17, 2024

(54) PEAK COMPARATOR CIRCUITRY

(71) Applicant: ams-Osram AG, Premstätten (AT)

(72) Inventor: Sébastien Poirier, Valencia (ES)

(73) Assignee: AMS-OSRAM AG, Premstätten (AT)

( * ) Notice: Subject to any disclaimer, the term of this patent is extended or adjusted under 35 U.S.C. 154(b) by 155 days.

(21) Appl. No.: 17/917,169

(22) PCT Filed: Mar. 22, 2021

(86) PCT No.: PCT/EP2021/057224
§ 371 (c)(1),
(2) Date: Oct. 5, 2022

(87) PCT Pub. No.: WO2021/204522
PCT Pub. Date: Oct. 14, 2021

(65) Prior Publication Data
US 2023/0163755 A1    May 25, 2023

(30) Foreign Application Priority Data

Apr. 6, 2020 (EP) .................................... 20168228

(51) Int. Cl.
*G01D 5/20* (2006.01)
*G01R 19/00* (2006.01)
*H03K 5/24* (2006.01)
(52) U.S. Cl.
CPC .................. *H03K 5/24* (2013.01); *G01D 5/20* (2013.01); *G01R 19/0038* (2013.01)
(58) Field of Classification Search
CPC ......... H03K 5/24; G01D 5/20; G01R 19/0038
See application file for complete search history.

(56) References Cited

U.S. PATENT DOCUMENTS

| 5,570,052 A | * | 10/1996 | Fonderie ................ H03K 5/082 327/64 |
| 2007/0075751 A1 | * | 4/2007 | Furuya ............... H03K 3/02337 327/112 |
| 2016/0072448 A1 | * | 3/2016 | Carrara ................. H03F 1/0205 330/260 |

OTHER PUBLICATIONS

Poirier, "Low Power High Speed High Accuracy Peak Comparator", 2012 International Conference on Analog VLSI Circuits AVIC2012, Oct. 24-26, 2012, 4 pages.
International Search Report and Written Opinion in corresponding International Application No. PCT/EP2021/057224 mailed on Jun. 16, 2021, 10 pages.

* cited by examiner

*Primary Examiner* — Jermele M Hollington
*Assistant Examiner* — Taqi R Nasir
(74) *Attorney, Agent, or Firm* — MH2 Technology Law Group LLP

(57) ABSTRACT

The peak comparator circuitry comprises a differential amplifier circuit having an output node to generate a differential amplifier output signal in response to an amplification of a difference of an input signal and a reference signal, and a comparator circuit having an output node to generate a comparator output signal. A feedback path of the peak comparator circuitry is arranged between the output node of the comparator circuit and the output node of the differential amplifier circuit. The proposed peak comparator circuitry allows for a low voltage supply, a low current consumption and a fast output validity.

15 Claims, 4 Drawing Sheets

PEAK COMPARATOR CIRCUITRY

CROSS-REFERENCE TO RELATED APPLICATIONS

The present application is the national stage entry of International Patent Application No. PCT/EP2021/057224, filed on Mar. 22, 2021, and published as WO 2021/204522 A1 on Oct. 14, 2021, which claims the benefit of priority of European Patent Application No. 20168228.3, filed on Apr. 6, 2020, all of which are incorporated by reference herein in their entireties.

TECHNICAL FIELD

The disclosure relates to a peak comparator circuitry that is able to detect when a peak voltage of an input signal is higher than a reference voltage. The disclosure further relates to a sensor device comprising a peak comparator circuitry.

BACKGROUND

In a large number of applications the course of a voltage must be monitored. In particular, it must be detected whether a voltage level is above or below a reference voltage. A peak comparator circuitry can be used for this purpose. The role of a peak comparator is to detect that a peak voltage of a periodic signal, for example a sinusoidal signal, is higher than a reference voltage. The main trade-off of the peak comparator is between accuracy and speed for a given current consumption.

Furthermore, it has to be considered that modern electric circuitries are operated with low voltage supplies. An additional requirement is therefore that the peak comparator circuit can be operated with a low supply voltage. The peak comparator circuit should thus be compatible with a low supply voltage of, for example, 1.8 V.

There is a desire to provide a peak comparator circuitry that has a low current consumption and can be operated with high accuracy and speed in a low supply voltage environment.

SUMMARY

An embodiment of a peak comparator circuitry that may be operated with a low voltage supply, has a low current consumption and shows a fast output validity is specified in claim 1.

According to an embodiment of the peak comparator circuitry, the comparator circuitry comprises an input terminal to apply an input signal, and a reference terminal to apply a reference signal. The peak comparator circuitry further comprises a differential amplifier circuit having an output node to generate a differential amplifier output signal in response to an amplification of a difference of the input signal and the reference signal. The peak comparator circuitry comprises a comparator circuit having an output node to generate a comparator output signal. The peak comparator circuitry further comprises a feedback path being arranged between the output node of the comparator circuit and the output node of the differential amplifier circuit.

The peak comparator circuitry allows to detect a peak of the input signal being higher than a level of the reference signal. Generally, the approach is to use a peak sampling circuit and compare the sampled voltage against a reference. In the proposed circuitry, a current peak detector being usually arranged as a subsequent stage after the differential amplifier circuit is deliberately omitted. Such a current peak detector leads in particular to a signal delay and cannot be operated in a low supply voltage domain.

The idea of the proposed circuitry is to lower the supply voltage and current consumption, wherein the circuitry has the same accuracy and speed as a conventional peak comparator circuitry using a current mode peak detector in the architecture of the comparator circuitry.

Further advantageous embodiments of the peak comparator circuitry which are discussed in the following are specified in the subclaims.

According to a possible embodiment of the peak comparator circuitry, the differential amplifier circuit is configured as an operational transconductance amplifier. The use of an operational transconductance amplifier for the differential amplifier circuit allows to reduce random error. The operational transconductance amplifier may be advantageously realized with a large differential pair which especially enables to significantly reduce the random error.

According to an embodiment of the peak comparator circuitry, the comparator circuit has a reference node to apply a secondary reference signal. The comparator circuit is configured to generate the comparator output signal in response to the differential amplifier output signal and the secondary reference signal.

In comparison to a conventional peak comparator circuitry which uses a current peak detector subsequent to the differential amplifier circuit, the current peak detector is replaced in the proposed architecture by the comparator circuit. The improved circuit configuration allows for a much lower voltage supply to operate the peak comparator circuitry and a lower current consumption of the peak comparator circuitry.

According to an advantageous embodiment of the peak comparator circuitry, the peak comparator circuitry comprises a feedback circuit being arranged in a current path of the feedback path between a supply terminal and the output node of the differential amplifier circuit.

The feedback circuit allows to latch the output value of the peak comparator circuitry. The use of a feedback circuit instead of a current peak detector having no feedback path allows for a fast output validity when an exceeding of the reference level by the input signal has been detected.

According to a possible embodiment of the peak comparator circuitry, the feedback circuit has a control node to apply the comparator output signal. The comparator output signal is applied to the control node to control latching of a state of the comparator output signal. The latching enables the output of the peak comparator circuitry to be immediately available, when the level of the input signal exceeds the level of the reference signal.

According to a possible embodiment of the peak comparator circuitry, the feedback circuit comprises a transistor. The transistor of the feedback circuit has a gate node coupled to the control node of the feedback circuit. Furthermore, the transistor of the feedback circuit has a source node coupled to the supply terminal and a drain node coupled to the output node of the differential amplifier circuit.

The output node of the comparator circuit is connected to the gate node of the transistor of the feedback circuit so that the comparator output signal is directly applied to the gate node of the transistor, i.e. to the control node of the feedback circuit. This configuration, in particular, the direct control of the gate node of the transistor/the control connection of the feedback circuit by the comparator output signal allows the immediate storage of the state of the comparator output signal.

According to an embodiment of the peak comparator circuitry, the comparator circuit is configured to generate the comparator output signal as a voltage signal.

In this case, the feedback path is configured as a voltage feedback path. The voltage signal of the comparator circuit triggers the feedback path. In particular, the voltage signal triggers the control node of the feedback circuit or the gate node of the transistor of the feedback circuit, thus latching the output value immediately, when the exceeding of the level of the reference signal by the level of the input signal has been detected.

According to an alternative embodiment of the peak comparator circuitry, the comparator circuit is configured to generate the comparator output signal as a current signal. According to this alternative embodiment, the peak comparator circuitry is realized by a current feedback between the output node of the comparator circuit and the output node of the differential amplifier circuit.

According to an advantageous embodiment of the peak comparator circuitry, the peak comparator circuitry comprises a controllable switch being arranged in the current path of the feedback path between the feedback circuit and the output node of the differential amplifier circuit.

The controllable switch provides an electrical connection between the feedback circuit and the output node of the differential amplifier circuit. In particular, the controllable switch provides an electrical connection between the drain node of the transistor of the feedback circuit and the output node of the differential amplifier circuit. The controllable switch allows to provide the peak comparator circuitry with a reset switch. In particular, the output of the peak comparator circuitry can be periodically reset by the controllable switch.

According to an embodiment of the peak comparator circuitry, the peak comparator circuitry comprises an amplifier circuit to generate an amplifier output signal in response to the differential amplifier output signal. The amplifier circuit is arranged between the output node of the differential amplifier circuit and the comparator circuit.

The amplifier circuit provides an electrical connection between the output node of the differential amplifier circuit and the input side of the comparator circuit. According to a possible embodiment of the circuit configuration of the peak comparator circuitry, the comparator circuit has an input node to apply the amplifier output signal. The comparator circuit is configured to generate the comparator output signal in response to the amplifier output signal and the secondary reference signal.

According to a possible embodiment of the peak comparator circuitry, the peak comparator circuitry comprises another feedback path being arranged between an input node of the amplifier circuit and an output node of the amplifier circuit. The input node of the amplifier circuit is coupled to the output node of the differential amplifier circuit. Furthermore, the output node of the amplifier circuit is coupled to the input node of the comparator circuit.

The provision of the additional feedback path between the input and output side of the amplifier circuit allows to regulate the voltage at the output node of the differential amplifier circuit to a desired value.

According to a possible embodiment, the other feedback path comprises a transistor or a resistor. In the particular embodiment, when the other feedback path between the input and output side of the amplifier circuit comprises a transistor, this circuit configuration allows the amplifier circuit to regulate the voltage at the output node of the differential amplifier circuit around a gate voltage of the transistor arranged in the other feedback path.

The proposed peak comparator circuitry can be provided in a plurality of applications which need to detect the occurrence of a signal peak in a signal course. According to a possible example for an application using the peak comparator circuitry, the peak comparator circuitry may be incorporated in a sensor device.

An embodiment of a sensor device is specified in claim 14. The sensor device comprises a circuit stage to provide a signal having a peak, and the peak comparator circuitry as described above or claimed in any of the claims 1 to 13. The circuit stage is coupled to the peak comparator circuitry such that the signal having the peak is applied to the input terminal of the peak comparator circuitry. According to a possible embodiment, the sensor device is configured as an inductive proximity sensor.

Additional features and advantages are set forth in the detailed description that follows. It is to be understood that both the foregoing general description and the following detailed description are merely exemplary, and are intended to provide an overview or framework for understanding the nature and character of the claims.

BRIEF DESCRIPTION OF THE DRAWINGS

The accompanying drawings are included to provide further understanding, and are incorporated in, and constitute a part of, the specification. As such, the disclosure will be more fully understood from the following detailed description, taken in conjunction with the accompanying figures in which.

DETAILED DESCRIPTION OF EMBODIMENTS

Figure 1:
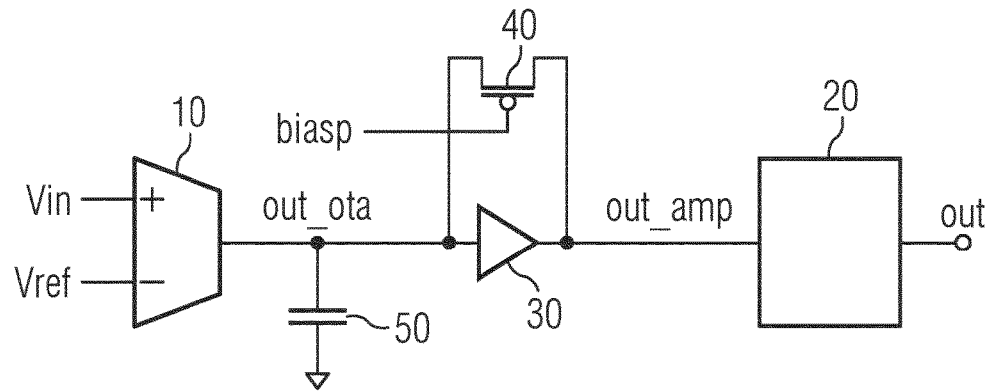
FIG. 1 shows an embodiment of a conventional peak comparator circuitry.

A conventional approach of a peak comparator circuitry uses a peak sampling circuit and compares the sampled voltage against a reference. The architecture of such a conventional peak comparator circuitry is shown in FIG. 1.

The circuitry is basically made of an operational transconductance amplifier 10, a peak comparator circuitry 20, and an amplifier 30. The amplifier 30 regulates the output of the operational transconductance amplifier 10 to have a reduced swing. The current mode peak detector 20 detects if the amplified output signal of the amplifier 30 has been higher than a level of a reference during an input signal half period.

When an input signal Vin applied to the operational transconductance amplifier 10 is higher than a reference voltage Vref, an output signal out_ota of the operational transconductance amplifier 10 starts to rise with a certain delay and forces the output signal out_amp of the amplifier 30 to fall. The amplifier 30 is connected to the current mode peak detector 20 that detects if the output signal out_amp of the amplifier 30 falls below a certain threshold during the half cycle.

The circuitry may be fabricated in the 0.35 μm high voltage technology. The architecture of the peak comparator circuitry consumes about 100 μA and may detect a voltage peak as low as 1 mV above the reference at 2 MHz frequency. The circuitry is operated with a minimum supply voltage of 3.3 V.

Modern electronic circuitries are operated with lower voltage supplies of about 1.8 V and are fabricated in a 0.18 μm process. Even if the conventional architecture of the peak comparator circuitry shown in FIG. 1 has a high speed and high accuracy, the circuitry cannot be used with modern low voltage supplies, for example a 1.8 V supply. Another disadvantage is that the shown configuration of the conventional peak comparator circuitry of FIG. 1 introduces a delay.

Figure 2:
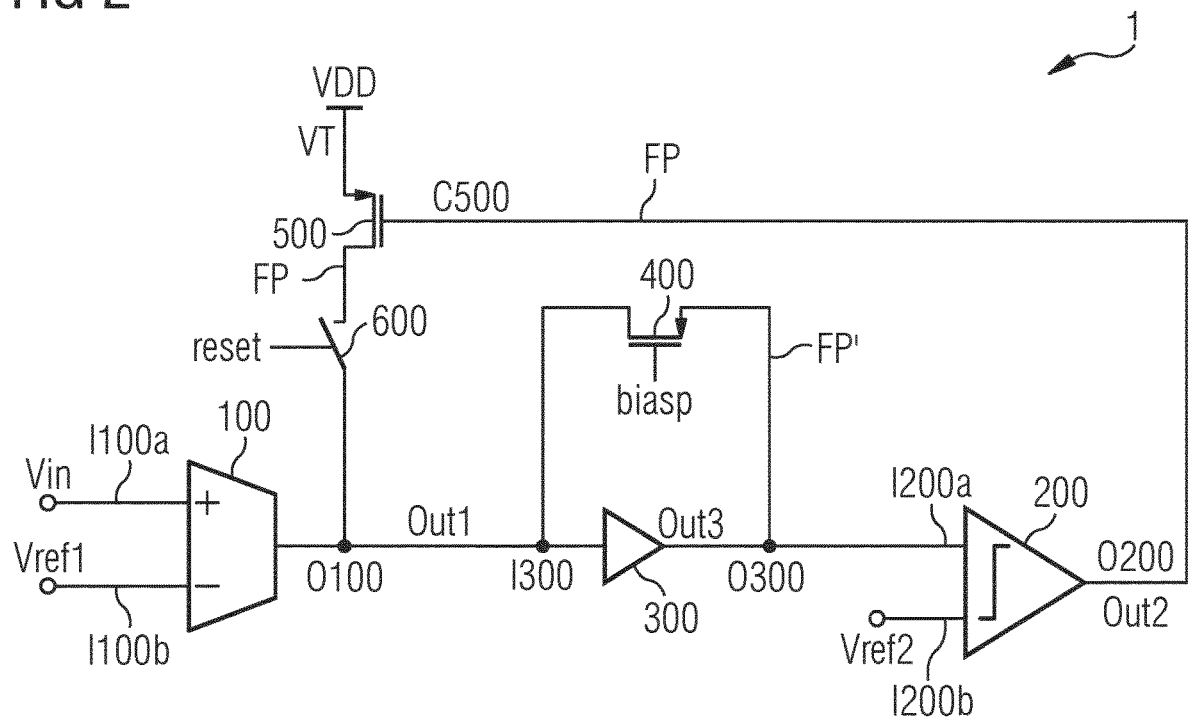
FIG. 2 shows an architecture of an improved embodiment of a peak comparator circuitry.

FIG. 2 shows an improved architecture of an embodiment of a peak comparator circuitry 1 that has a low current consumption and can be operated with a low supply voltage, for example a supply voltage of 1.8 V, at the same accuracy and speed as the conventional configuration of the peak comparator circuitry shown in FIG. 1. The different components of the peak comparator circuitry 1 are described in the following.

The peak comparator circuitry 1 comprises an input terminal I100a to apply an input signal Vin. The comparator circuitry further comprises a reference terminal I100b to apply a reference signal Vref1. Furthermore, the peak comparator circuitry 1 comprises a differential amplifier circuit 100 which has an output node O100 to generate a differential amplifier output signal Out1 in response to a comparison of the input signal Vin and the reference signal Vref1. The differential amplifier circuit 100 may be configured as an operational transconductance amplifier.

FIG. 2 shows the differential amplifier circuit 100 in a single-ended configuration having the input terminal I100a to apply the single-ended input signal Vin and the reference terminal I100b to apply the single-ended reference signal Vref1. It has to be noted that the configuration of the amplifier circuit 100 is not limited to the single ended input architecture. According to another possible embodiment, the differential amplifier circuit 100 can be configured for applying a differential input signal and a differential reference signal.

The peak comparator circuitry 1 further comprises a comparator circuit 200 having an output node O200 to generate a comparator output signal Out2. Moreover, the peak comparator circuitry 1 comprises a feedback path FP being arranged between the output node O200 of the comparator circuit 200 and the output node O100 of the differential amplifier circuit 100.

The comparator circuit 200 has a reference node I200b to apply a secondary reference signal Vref2. The comparator circuit 200 is configured to generate the comparator output signal Out2 in response to the differential amplifier output signal Out1 and the secondary reference signal Vref2.

According to the embodiment of the peak comparator circuitry 1 shown in FIG. 2, the circuitry comprises a feedback circuit 500 being arranged in a current path of the feedback path FP between a supply terminal VT and the output node O100 of the differential amplifier circuit 100. The supply terminal VT is configured to apply a supply voltage VDD.

According to a possible embodiment of the peak comparator circuitry 1, the circuitry may comprise a controllable switch 600 being arranged in the current path of the feedback path FP between the feedback circuit 500 and the output node O100 of the differential amplifier circuit 100. The feedback circuit 500 has a control node C500 to apply the comparator output signal Out2.

According to the embodiment of the peak comparator circuitry 1 shown in FIG. 2, the feedback circuit 500 comprises a transistor. The transistor of the feedback circuit 500 has a gate node coupled to the control node C500 of the feedback circuit. The transistor of the feedback circuit 500 further has a source node coupled to the supply terminal VT and a drain node coupled to the output node of the differential amplifier circuit 100 directly or via the controllable switch 600.

According to the embodiment of the peak comparator circuitry 1 shown in FIG. 2, the comparator circuit 200 is configured to generate the comparator output signal Out2 as a voltage signal that is applied to the control node C500 of the feedback circuit 500. According to the embodiment of the peak comparator circuitry 1 of FIG. 2, the feedback path FP is configured as a positive feedback path.

According to another embodiment, the feedback path FP between the output node O100 of the differential amplifier circuit 100 and the output node O200 of the comparator circuit 200 is realized as a current feedback between the output node O200 of the comparator circuit 200 and the output node O100 of the differential amplifier circuit 100 instead of a voltage feedback through the feedback circuit 500, i.e. the transistor of the feedback circuit 500. In this case, the comparator circuit 200 is configured to generate the comparator output signal Out2 as a current signal.

According to the embodiment of the peak comparator circuitry 1 of FIG. 2, the circuitry comprises an amplifier circuit 300 to generate an amplifier output signal Out3 in response to the differential amplifier output signal Out1. The amplifier circuit 300 is arranged between the output node O100 of the differential amplifier circuit 100 and the comparator circuit 200.

The comparator circuit 200 has an input node I200a to apply the amplifier output signal Out3. The comparator circuit 200 is configured to generate the comparator output signal Out2 in response to the amplifier output signal Out3 and the secondary reference signal Vref2 applied to the reference node I200b.

According to the shown embodiment of the peak comparator circuitry 1, the circuitry comprises a feedback path FP' being arranged between an input node I300 of the amplifier circuit 300 and an output node O300 of the amplifier circuit 300. The input node I300 of the amplifier circuit 300 is coupled to the output node O100 of the differential amplifier circuit 100. The output node O300 of the amplifier circuit 300 is coupled to the input node I200a of the comparator circuit 200.

According to the shown embodiment of the peak comparator circuitry, the feedback path FP' comprises a transistor 400, as illustrated in FIG. 2. According to an alternative embodiment, the transistor 400 can be replaced by a resistor being arranged between the input node I300 of the amplifier circuit 300 and the output node O300 of the amplifier circuit 300.

In summary, the general concept of the improved embodiment of the peak comparator circuitry 1 comprises three main parts: the differential amplifier circuit 100 which may be configured as an operational transconductance amplifier, the amplifier circuit 300 with the feedback path FP', and the comparator circuit 200 being coupled to the feedback circuit 500 that may be embodied as a latching transistor.

In the following, the operation of the peak comparator circuitry 1 is described.

The differential amplifier circuit 100, for example an operational transconductance amplifier, amplifies the difference between the input signal Vin, for example an input voltage, and the reference signal Vref1, for example a reference voltage. Since the sizes of the transistors of the differential amplifier circuit/operational transconductance amplifier 100 depend on needed matching, a high capacitive load can be seen at the output node O100 where accuracy is needed.

The amplifier circuit 300 regulates the voltage at the output node O100 of the differential amplifier circuit 100 around a gate voltage of the transistor 400, when the input voltage Vin is below the reference voltage Vref1. The feedback path FP' provides the output node O100 as a low impedance node.

When the level of the input signal Vin is higher than the level of the reference signal Vref1, the potential at the output node O100 of the differential amplifier circuit 100 rises and forces the potential of the amplifier output signal Out3 to fall with almost no delay. Once the level of the amplifier output signal Out3 is above the level of the secondary reference signal Vref2, the comparator output signal Out2 will fall. In conclusion, the transistor of the feedback circuit 500 is operated in a conductive state, and the potential at the output node O100 rises faster when the controllable switch 600 is operated in a closed/conductive state.

The system will latch with a comparator output signal Out2 at zero level due to the positive feedback. The feedback circuit 500 starts latching, and the controllable switch 600 ends the latching, when the controllable switch 600 is turned in the open/non-conductive state. Moreover, the circuitry 1 can be periodically reset with the controllable switch 600 that is used as a reset switch.

The main idea of the improved embodiment of the peak comparator circuitry 1 of FIG. 2 in comparison to the conventional approach of the peak comparator circuitry illustrated in FIG. 1 is to replace the second stage current peak detector 20 by the comparator circuit/voltage comparator 200 whose output triggers a feedback loop, latching the output value. The new insight is to use a latching system instead of a current peak detector. This allows for a much lower voltage supply, a lower current consumption and a faster output validity. If the peak of the input signal Vin is above the threshold provided by the reference signal Vref1, the output of the peak comparator circuitry 1 is immediately valid.

When compared to the conventional embodiment of the peak comparator circuitry shown in FIG. 1, the latching realized with the peak comparator circuitry 1 enables the output to be immediately available once the reference voltage of the reference signal Vref1 is crossed, while the output of the current peak detector 20 of the conventional approach of the peak comparator circuitry needs time to settle. This time depends on the input voltage, effectively limiting the speed of the conventional approach of the peak comparator circuitry.

A particular advantage of the peak comparator circuitry 1 of FIG. 2 is that the circuitry can be operated with a low voltage supply. The peak comparator circuitry 1 requires a supply voltage one threshold voltage less than the conventional approach of the peak comparator circuitry of FIG. 1. In particular, the current peak detector 20 of the conventional approach of the peak comparator circuitry needs a supply higher than two threshold voltages and two drain source voltages to work.

This makes the proposed improved architecture of the peak comparator circuitry 1 compatible with a 1.8 V supply and a 0.18 μm process. Furthermore, the peak comparator circuitry 1 allows less bias voltages and lower currents to be required in comparison to the conventional approach.

Figure 3:
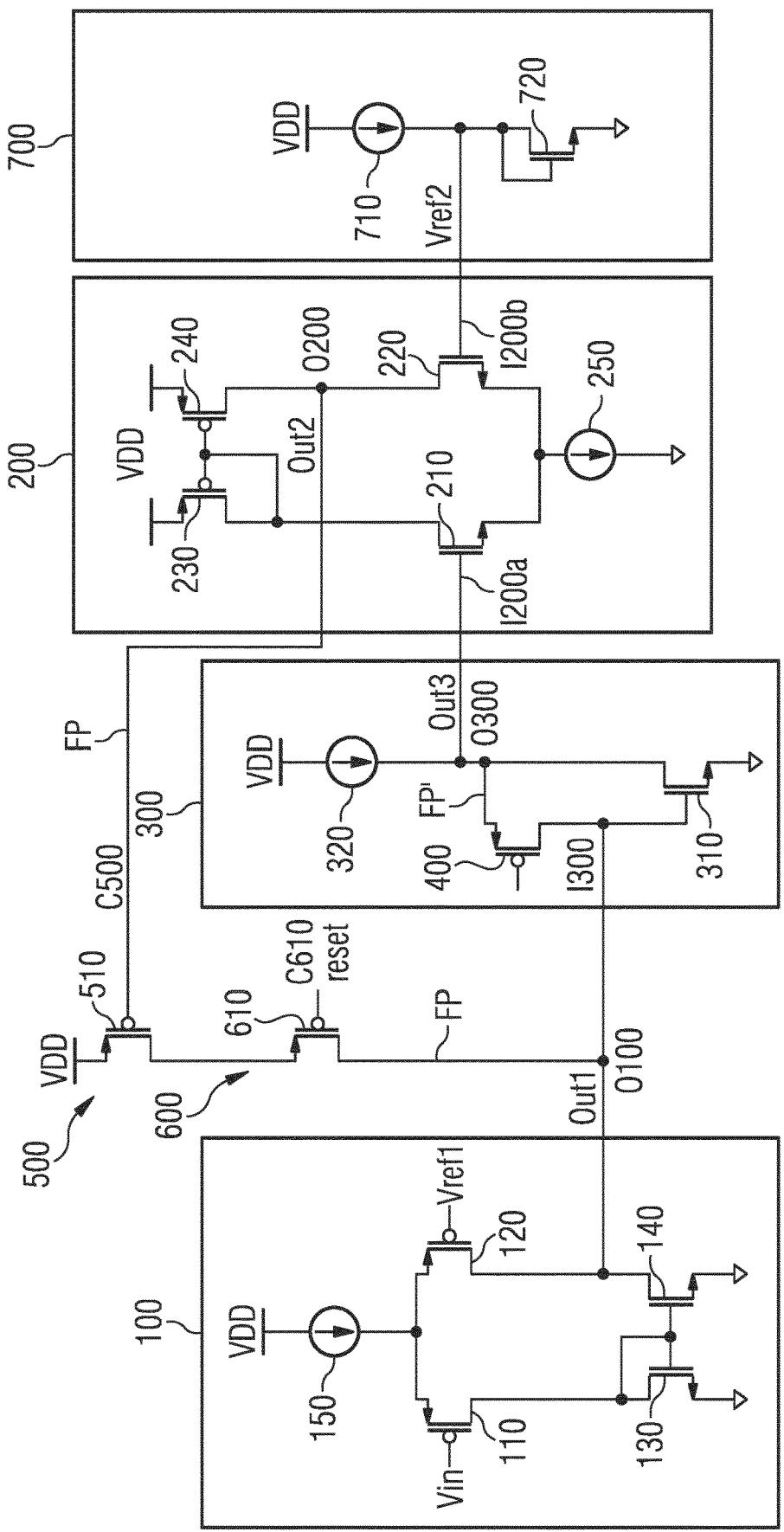
FIG. 3 illustrates a detailed schematic implementation of the architecture of the peak comparator circuitry shown in FIG. 2.

FIG. 3 illustrates a detailed schematic implementation of the architecture of the peak comparator circuitry 1 shown in FIG. 2. The differential amplifier circuit 100 is realized as an operational transconductance amplifier that comprises a differential pair of transistors 110 and 120, and a current mirror realized by transistors 130 and 140. The differential amplifier circuit 100 further comprises a current source 150.

The differential amplifier output signal Out1 provided at the output node O100 of the differential amplifier is applied to the input node I300 of the amplifier circuit 300 which is realized by transistor 310 and current source 320. The amplifier output signal Out3 provided at the output node O300 of the amplifier circuit 300 is fed back to the input node I300 of the amplifier circuit 300 via feedback path FP' comprising transistor 400.

The comparator circuit 200 comprises a differential pair of transistors 210 and 220, and transistors 230 and 240 realizing a current mirror. The secondary reference signal Vref2 provided at the reference node I200b of the comparator circuit 200 is generated by a circuit 700 comprising current source 710 and diode connected transistor 720.

The comparator output signal Out2 is fed back at the output node O200 of the comparator circuit 200 via the feedback path FP to the control node C500 of the feedback circuit 500. The feedback circuit 500 is realized by transistor 510 so that the feedback path FP is embodied as a positive feedback path.

The controllable switch 600 is realized by transistor 610 having a control/gate node C610 to apply the control signal reset. Transistor 610 is arranged between the drain node of transistor 510 and the output node O100 of the differential amplifier circuit/operational transconductance amplifier 100.

It has to be noted that current sources 150, 250, 320 and 710 are shown as ideal as they are not critical.

Further embodiments of the peak comparator circuitry 1 can be provided with the following differences.

The differential amplifier circuit/operational transconductance amplifier 100 and the comparator circuit 200 may be realized by an architecture being different from the architecture shown in FIG. 3. For example, the transistors 110 and 120 of the differential amplifier circuit/operational transconductance amplifier may be provided as an n-type differential pair instead of a p-type differential pair. Moreover, the differential amplifier circuit 100 or the comparator circuit 200 may be implemented as a telescopic or folded-cascode or any similar circuit.

According to another possible embodiment, an offset compensation scheme is provided at the input side of the differential amplifier circuit 100/operational transconductance amplifier or at the input side of the amplifier circuit 300.

According to further possible embodiment, a structure to clamp the output node is provided.

Moreover, as explained above, a resistor instead of a transistor 400 can be provided in the feedback path FP'.

Furthermore, as another option, a current feedback is provided between the output node O200 of the comparator circuit 200 and the output node O100 of the differential amplifier circuit 100 instead of a voltage feedback through latching transistor 510.

Figure 4:
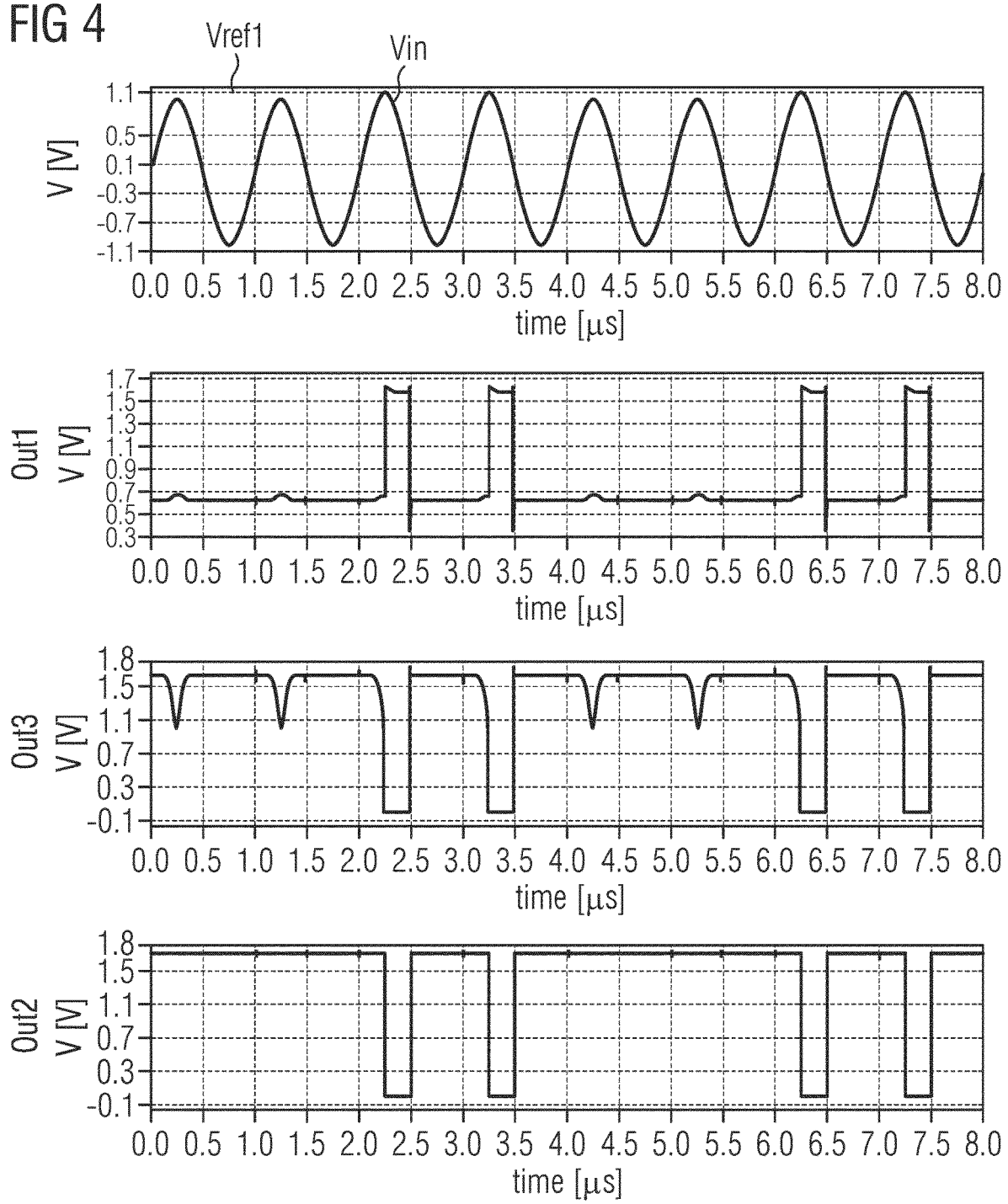
FIG. 4 shows simulation results of an operation of the improved embodiment of the peak comparator circuitry.

Simulation results of the operation of the peak comparator circuitry 1 are illustrated in FIG. 4 in which various curves of signal voltages are plotted over a time axis. The upper part of FIG. 4 shows the curve of a sinusoidal input signal Vin and the reference signal Vref1. This is followed by the signal voltage of the differential amplifier output signal Out1 at the output node O100 of the differential amplifier circuit 100, the signal voltage of the amplifier output signal Out3 at the output node O300 of the amplifier circuit 300, and the signal voltage of the comparator output signal Out2 at the output node of the comparator circuit 200.

As shown in the upper plot as an example of an input signal Vin, a 1 MHz sinewave the peak of which is 1 mV above and below the reference is simulated. The output of the peak comparator circuitry goes immediately to the zero level when the peak voltage of the input signal Vin is 1 mV above the level of the reference signal Vref1. Total current consumption of the peak comparator circuitry 1 is only 50 µA of the conventional circuit of FIG. 1, and supply voltage is 1.7 V for the proposed circuit architecture instead of 3.3 V which is needed for operating the conventional peak comparator circuitry of FIG. 1.

Figure 5:
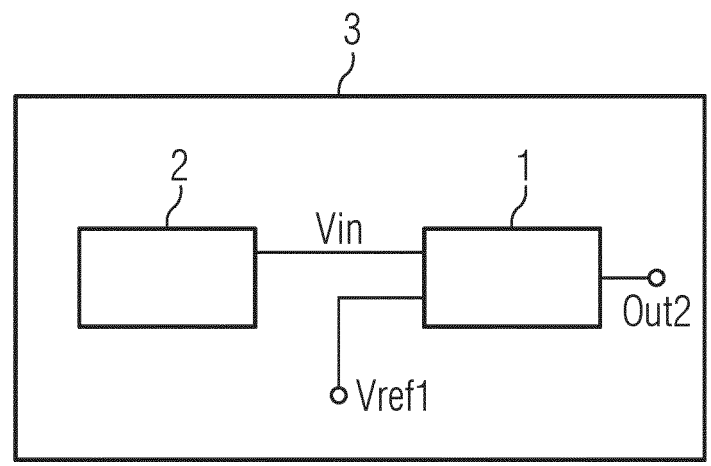
FIG. 5 illustrates an embodiment of a sensor device comprising a peak comparator circuitry.

The proposed approach of the peak comparator circuitry 1 can basically be used for any application where a peak comparison is required. FIG. 5 shows as an example a sensor device 3 comprising a circuit stage 2 to provide a signal Vin having a peak. The sensor device further comprises the peak comparator circuitry 1 to detect whether the peak voltage of the signal Vin provided by the circuit stage 2 is higher than the reference voltage Vref1. The circuit stage 2 is coupled to the peak comparator circuitry 1 such that the signal Vin having the peak is applied to the input terminal I100a of the peak comparator circuitry 1. The circuit stage 2 outputs the comparator output signal Out2 in response to the level of the signal Vin. The sensor device can be designed as any sensor. For example, the sensor device 3 may be configured as an inductive proximity sensor.

The embodiments of the peak comparator circuitry disclosed herein have been discussed for the purpose of familiarizing the reader with novel aspects of the present invention. Although preferred embodiments have been shown and described, many changes, modifications, equivalents and substitutions of the disclosed concepts may be made by one having skill in the art without unnecessarily departing from the scope of the claims.

In particular, the invention is not limited to the disclosed embodiments, and gives examples of many alternatives as possible for the features included in the embodiments discussed. However, it is intended that any modifications, equivalents and substitutions of the disclosed concepts be included within the scope of the claims which are appended hereto.

Features recited in separate dependent claims may be advantageously combined. Moreover, reference signs used in the claims are not limited to be construed as limiting the scope of the claims.

Furthermore, as used herein, the term "comprising" does not exclude other elements. In addition, as used herein, the article "a" is intended to include one or more than one component or element, and is not limited to be construed as meaning only one.

The invention claimed is:

1. A peak comparator circuitry, comprising:
an input terminal to apply an input signal,
a reference terminal to apply a reference signal,
a differential amplifier circuit having an output node to generate a differential amplifier output signal in response to an amplification of a difference of the input signal and the reference signal,
a comparator circuit having an output node to generate a comparator output signal,
a feedback path being arranged between the output node of the comparator circuit and the output node of the differential amplifier circuit, and
a feedback circuit being configured to control latching of the comparator output signal.

2. The peak comparator circuitry of claim 1, wherein:
the comparator circuit has a reference node to apply a secondary reference signal, and
the comparator circuit is configured to generate the comparator output signal in response to the differential amplifier output signal and the secondary reference signal.

3. The peak comparator circuitry of claim 1, wherein the feedback circuit is arranged in a current path of the feedback path between a supply terminal and the output node of the differential amplifier circuit.

4. The peak comparator circuitry of claim 3, comprising:
a controllable switch being arranged in the current path of the feedback path between the feedback circuit and the output node of the differential amplifier circuit.

5. The peak comparator circuitry of claim 3, wherein the feedback circuit has a control node to apply the comparator output signal.

6. The peak comparator circuitry of claim 5, wherein:
the feedback circuit comprises a transistor,
the transistor of the feedback circuit has a gate node coupled to the control node of the feedback circuit, and
the transistor of the feedback circuit has a source node coupled to the supply terminal and a drain node coupled to the output node of the differential amplifier circuit directly or via a controllable switch.

7. The peak comparator circuitry of claim 1, wherein the comparator circuit is configured to generate the comparator output signal as a voltage signal.

8. The peak comparator circuitry of claim 1, wherein the comparator circuit is configured to generate the comparator output signal as a current signal.

9. The peak comparator circuitry of claim 1, comprising:
an amplifier circuit to generate an amplifier output signal in response to the differential amplifier output signal, the amplifier circuit being arranged between the output node of the differential amplifier circuit and the comparator circuit.

10. The peak comparator circuitry of claim 9, wherein:
the comparator circuit has an input node to apply the amplifier output signal, and
the comparator circuit is configured to generate the comparator output signal in response to the amplifier output signal and a secondary reference signal.

11. The peak comparator circuitry of claim 10, comprising:
another feedback path being arranged between an input node of the amplifier circuit and an output node of the amplifier circuit,
wherein the input node of the amplifier circuit is coupled to the output node of the differential amplifier circuit, and the output node of the amplifier circuit is coupled to the input node of the comparator circuit.

12. The peak comparator circuitry of claim 11, wherein the another feedback path comprises a transistor or a resistor.

13. The peak comparator circuitry of claim 1, wherein the differential amplifier circuit is configured as an operational transconductance amplifier.

14. A sensor device, comprising:
a circuit stage to provide a signal having a peak,
a peak comparator circuitry as claimed in claim 1,
wherein the circuit stage is coupled to the peak comparator circuitry such that the signal having the peak is applied to the input terminal of the peak comparator circuitry.

15. The sensor device of claim 14, wherein the sensor device is configured as an inductive proximity sensor.

\* \* \* \* \*